TEMPERATURE COMPENSATED ALTERNATING-CURRENT AMPLIFIER

Filed Feb. 5, 1963

INVENTORS,
JAMES D. MEINDL
OCTAVIUS PITZALIS JR.
BY Julian C. Keppler
ATTORNEY

3,264,571
TEMPERATURE COMPENSATED ALTERNATING-CURRENT AMPLIFIER

James D. Meindl, Long Branch, and Octavius Pitzalis, Jr., Fair Haven, N.J., assignors to the United States of America as represented by the Secretary of the Army Filed Feb. 5, 1963, Ser. No. 256,480
2 Claims. (Cl. 330—23)

The invention described herein may be manufactured and used by or for the Government for governmental purposes without the payment of any royalty thereon.

The invention relates to temperature compensation and particularly to the temperature compensation of a transistor circuit. More particularly, this invention relates to the compensation of the variation in the alternating current parameters of a transistor amplifier with respect to temperature.

Temperature compensation is well known in electrical circuitry and has been extensively applied to transistor circuitry because of the inherent instability of the transistor with respect to temperature. Most temperature compensation is accomplished by means of temperature variable resistances, such as thermistors.

Thermistors have been used, individually, in almost all branches of transistor amplifier networks, and have been used in combination, usually as voltage dividers, to maintain the direct current parameters of the transistor circuit fairly constant over a wide range of temperature variation.

However, this temperature compensation is primarily for the direct-current biasing of the transistor with respect to temperature by partial compensation for the changes in the gain of the transistor with respect to temperature. Neither of these factors has a direct relationship to the mutual changes in the alternating-current impedance and alternating-current gain of the transistor with respect to temperature, and both the input and output alternating-current impedances of a transistor amplifier circuit, as well as the gain, may vary over a considerable range, even when the direct-current characteristics have been compensated.

It is therefore an object of this invention to provide an improved compensation for the alternating-current impedance and gain variations of a transistor with respect to temperature.

It is a further object of this invention to provide the alternating-current impedance and gain compensations for a transistor while holding the direct-current biasing of the transistor within tolerable and predictable limits over a given temperature range.

These and other objects are accomplished by adding temperature varying resistors, or thermistors, to all of the arms of a transistor circuit and making the changes in the resistance of the various thermistors combine to compensate, simultaneously, for the changes in the alternating-current impedance and the alternating-current gain of the transistor as the temperature changes. This overall compensation consists of a careful blending of temperature-variable input current shunting together with temperature-variable negative feedback.

This invention will be better understood and other and further objects of this invention will become apparent from the following specification and the drawings, of which:

Figure 1:
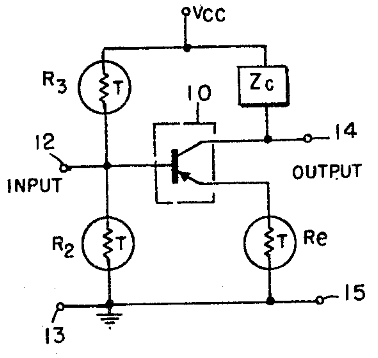
FIG. 1 shows the circuit components necessary for the compensation of the alternating-current input impedance, and the alternating-current gain of the circuit.

Referring now more particularly to FIG. 1, the transistor 10 is connected in an amplifying circuit which has input terminals 12 and 13, and output terminals 14 and 15. The temperature variable resistors $R_2$ and $R_3$ form a voltage divider between the source of voltage $V_{CC}$ and ground. One input terminal 12 connects to the junction of the temperature variable resistors $R_2$ and $R_3$ and to the input, or base electrode, of the transistor. The emitter electrode of the transistor connects, through another temperature variable resistor $R_e$, to ground. The other input terminal 13 connects to the grounded end of the resistors $R_2$ and $R_e$.

The collector electrode connects through an external collector impedance $Z_c$ to the source of voltage $V_{CC}$. One output terminal 14 is connected to the collector electrode, and the other output terminal 15 is grounded.

Figure 2:
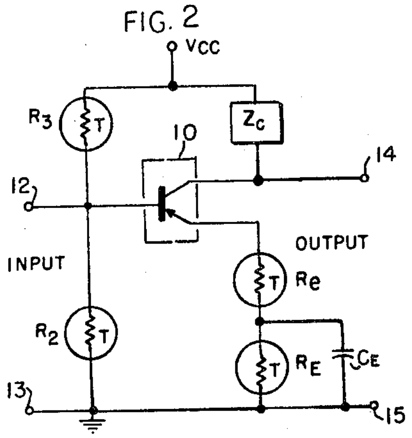
FIG. 2 shows the same circuit with additional direct-current temperature compensation of the emitter bias for direct-current stability impedance.

FIG. 2 is similar to FIG. 1 with the addition of another temperature variable resistor $R_E$ connected between the resistor $R_e$ and ground. Since this resistor $R_E$ is for direct-current bias compensation only, it is bypassed for alternating-current by the parallel-connected condenser $C_E$.

Figure 3:
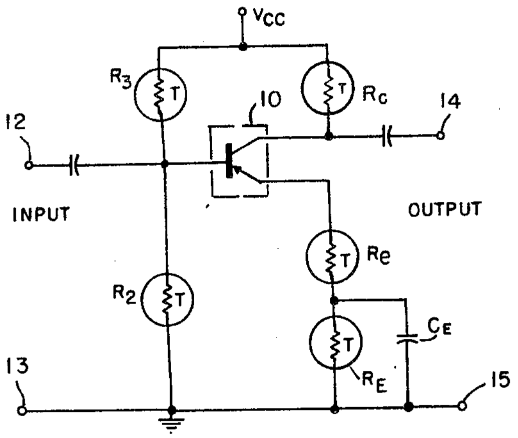
FIG. 3 shows a circuit for the compensation of the input and the output alternating-current impedance and the gain of the amplifier.

FIG. 3 is similar to FIGS. 1 and 2 with the addition of temperature variable resistor $R_c$ connected between the collector electrode and the source of voltage $V_{CC}$. This resistor is of the same order of magnitude as, and takes the place of, the external collector impedance $Z_c$. It compensates for the temperature variations in the output impedance of the transistor due to changes in temperature.

Figure 4:
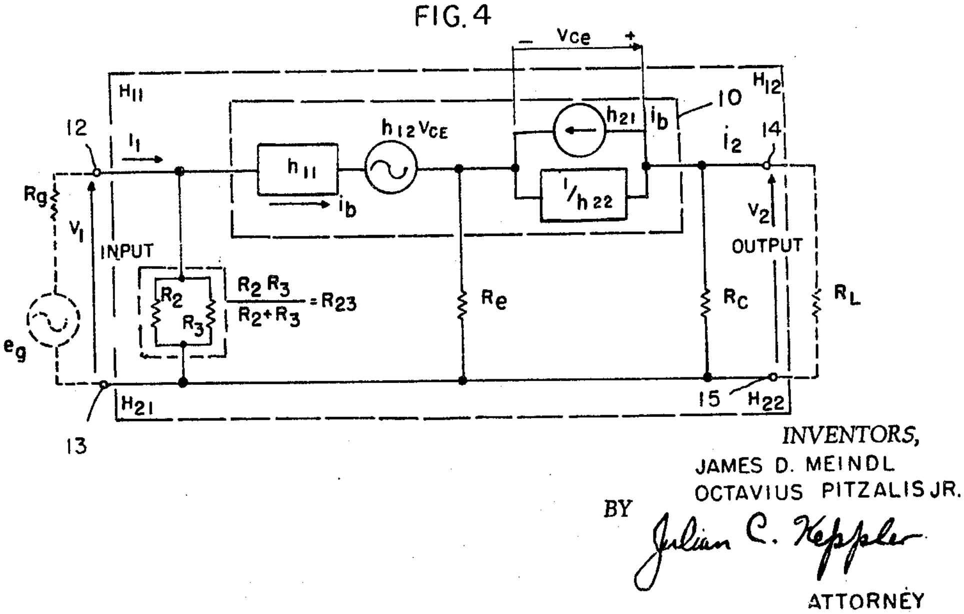
FIG. 4 represents the alternating-current characteristics of the foregoing circuits with the transistor represented by its equivalent four-pole *h*-parameter characteristics.

FIG. 4 shows the circuit of FIG. 3, specifically, from the alternating current equivalent circuit concept. In this diagram the resistors $R_2$ and $R_3$ are effectively in parallel across the input terminals 12 and 13; the resistance $R_c$ is across the output terminals 14 and 15; and the resistor $R_e$ appears between the emitter electrode 10, representing the transistor, and ground; the bypassed resistor $R_E$ does not appear in the alternating-current analogy.

The transistor 10 is represented by its equivalent "*h*" or hybrid parameters, which are the four-pole, small-signal, alternating-current characteristics of the transistor. These parameters are necessary for setting up the equations for determining the values and temperature coefficients of the temperature variable resistors for operations under any given conditions. The "*h*" parameters, as shown in FIG. 4, are:

$h_{11}$—(short-circuit input impedance), which is the small signal input impedance of the transistor with its output short-circuited for alternating current.

$h_{12}$—(reverse voltage transfer ratio) which is the ratio of the open-circuited input voltage to the impressed output voltage producing it.

$h_{21}$—(short-circuit current gain), which is the ratio of the alternating-current, short-circuited, output current to the input current causing it; and $h_{22}$—(output admittance with the input open-circuited) which is the ratio of the output current to the causal voltage impressed at the output when the input is open-circuited.

The entire circuit is represented by the "H" parameters, which are the small-signal, four-pole, hybrid parameters of the circuit. These are defined exactly as the "*h*" parameters, of corresponding subscript, except that the "H" parameters apply to the entire circuit instead of only to the transistor.

The gamma ($\gamma$) term is the ratio of the resistance of the thermistor at an upper temperature $T_x$ to its resistance at a lower temperature $T_y$. Referring to the transistor amplifier of FIG. 3, the circuit has five resistors ($R_E$, $R_e$, $R_2$, $R_3$, and $R_c$), one voltage supply $V_{CC}$, and, consequently, six variable temperature factors ($\gamma_E$, $\gamma_e$, $\gamma_2$, $\gamma_3$, $\gamma_c$, and $\gamma_{VCC}$) which may be used to satisfy both direct current and alternating current design considerations. Basically the alternating current compensation of a transistor amplifier is determined by matching the values of the "H" parameters of the circuit at the operating temperature limits of the transistor amplifier circuit.

By anticipating the lower and the upper values of these operating temperature limits ($T_y$ and $T_x$) respectively, and by selecting the transistor current (I) and voltages (V) of the operating points, with respect to the emitter (E), collector (C), and base (B) electrodes, corresponding to the lower ($y$) and the upper ($x$) limits of the operating temperature range, the essential transistor direct current characteristics ($I_{By}$, $V_{BEy}$ and $I_{Bx}$, $V_{BEx}$ respectively) and the alternating current characteristics ($h_{11y}$, $h_{12y}$, $h_{21y}$, $h_{22y}$ and $h_{11x}$, $h_{12x}$, $h_{21x}$, $h_{22x}$ respectively) may be found from measurements. (The present theory assumes that the range of the amplifier operating frequencies is such that the transistor four-pole parameters remain purely real.)

From the direct current analysis, four (e.g., $V_{CC}$, $R_2$, $R_3$, and $R_C$) of the twelve circuit quantities are specified. The remaining quantities are determined primarily from the alternating current analysis.

Considering FIG. 4 and the four-pole equations $$v_1=H_{11}i_1+H_{12}v_2$$

and $$i_2=H_{21}i_1+H_{22}v_2 \qquad (1)$$

it is evident that the "H" parameters define the small-signal alternating-current characteristics of the circuit. Consequently, amplifier temperature compensation may be accomplished by suitably restricting the temperature behavior of the "H" parameters. In this case the imposed restrictions are $$H_{11y}=H_{11x}$$
$$H_{21y}=H_{21x} \qquad (2)$$

and $$H_{22y}=H_{22x}$$

The reverse voltage transfer ratio, $H_{12}$, is not included here since its effect on circuit behavior is negligibly small. Substituting the approximate values for the "H" parameters gives $$\frac{(h_{11y}+h_{21y}R_e)R_{23}}{(h_{11y}+h_{21y}R_e)+R_{23}}=\frac{(h_{11x}+h_{21x}\gamma_eR_e)\gamma_{23}R_{23}}{(h_{11x}+h_{21x}\gamma_eR_e)+\gamma_{23}R_{23}} \qquad (3)$$

$$\frac{(h_{21y})R_{23}}{(h_{11y}+h_{21y}R_e)+R_{23}}=\frac{(h_{21x})\gamma_{23}R_{23}}{(h_{11x}+h_{21x}\gamma_eR_e)+\gamma_{23}R_{23}} \qquad (4)$$

and $$1/R_C=1/\gamma_CR_C \qquad (5)$$

It is found that a most useful solution to Equations 3, 4, and 5 results from equating numerators and denominators. Choosing $\gamma_2=\gamma_3=\gamma_{23}$, this gives $$\gamma_{23}=h_{21y}/h_{21x} \qquad (6)$$

$$\gamma_e=\gamma_{23}\frac{R_{23}-h_{11x}}{\gamma_{23}R_{23}-h_{11y}} \qquad (7)$$

$$R_e=\frac{\gamma_{23}R_{23}-h_{11y}}{h_{21y}} \qquad (8)$$

and $$\gamma_C=1 \qquad (9)$$

In order to assure $\gamma_e>0$ and $R_e>0$, (7) and (8) require $$R_{23}>h_{11x} \text{ and } \gamma_{23}R_{23}>h_{11y} \qquad (10)$$

Equations 6 through 9 specify five additional circuit quantities, giving a total of nine of the original twelve unknowns. The remaining quantities may be chosen as desired within reasonable limits. Normally, $\gamma_v=1$ and $\gamma_E$ and $R_E$ are selected to maximize the alternating current power gain ($G_x$) and minimize the total power dissipation ($P_x$) of the circuit. When these goals conflict, a reasonable compromise results if one maximizes the quotient of the alternating current power gain and the direct current power dissipation.

With the "H" parameters completely specified, the power gain $$G=\frac{H_{21}^2R_L}{(1+H_{22}R_L)(H_{11}+\Delta H_{R_e})}\simeq\frac{H_{21}^2}{H_{11}}\frac{R_L}{(1+R_L/R_C)^2} \qquad (11)$$

the input impedance $$R_i=\frac{H_{11}+\Delta H_{R_L}}{1+H_{22}R_L}\simeq H_{11} \qquad (12)$$

and the output impedance $$R_o=\frac{R_z+H_{11}}{H_{22}R_g+\Delta H}\simeq R_C \qquad (13)$$

of the circuit in FIGURE 3 may be determined readily.

Since $H_{12}$ is insignificant at frequencies for which the transistor will normally be employed in this circuit, it has been discarded, for practical purposes, in these equations. Therefore the foregoing equations apply equally well to the circuits of FIGURES 1 and 2.

The temperature compensation of the alternating current characteristics of a transistor amplifier, made in accordance with this invention, applied equally well to iterative matching, image matching, or even mismatching of the input source and/or the output load.

In a typical temperature compensated circuit according to the teachings of this invention, a diffused base, 2N1613 silicon transistor, made by the Fairchild Corporation was used, and the values and characteristics of the other elements of the circuit, at the lower temperature limit were:

$R_E$=491 ohms $\gamma_E$=.991
$R_e$=195 ohms $\gamma_e$=1.02
$R_2$=22,700 ohms $\gamma_2$=.42
$R_3$=155,000 ohms $\gamma_3$=.42
$R_c$=4,300 ohms $\gamma_c$=1.00
$V_{CC}$=20 volts $\gamma V_{CC}$=1.00
(Note that the $\gamma_2=\gamma_3=\gamma_{23}$)

The direct current power dissipation at the upper temperature limit is 53.6 milliwatts.

The curves of available thermistors can be used to obtain the resistance value of a given thermistor at any particular temperature as well as the change in the resistance of the thermistor between any two temperatures. Other characteristics are obtained by combining a given thermistor with other resistors or thermistors.

The following section indicates the agreement which has been achieved between this design theory and measured circuit performance. The results described in this section are based on the behavior of a typical small-signal diffused-base silicon transistor. The temperature range of interest is $T_y=-30°$ C.$\leq T\leq$100° C.$=T_x$. The data corresponding to a typical set of operating points are:

(a) Direct current operating points:

$I_{Cy}$=1.4 ma. $V_{CEy}$=13.0 v. $I_{Cx}$=2.6 ma. $V_{CEx}$=7.0 v.

(b) Direct current characteristics:

$I_{By}$=42.3 $\mu$a. $V_{BEy}$=0.74 v. $I_{Bx}$=31.4 $\mu$a. $V_{BEx}$=0.5 v.

and (c) Alternating current characteristics:

$h_{11y}$=680 ohms, $h_{12y}=1.21\times10^{-4}$, $h_{21y}$=39.3, $h_{22y}=2.82\times10^{-5}$ ohms$^{-1}$ $h_{11x}$=1200 ohms, $h_{12x}=3.2\times10^{-4}$, $h_{21x}$=93.2, $h_{22x}=8.95\times10^{-5}$ ohms$^{-1}$ It is noted that the transistor alternating current characteristics change drastically for the temperature range under consideration.

The temperature variations in the amplifier parameters corresponding to the above quantities were measured to be as follows over a temperature range of −10° C. to +75° C.

The input impedance varies from −20% to +28% of its nominal or 25° C. value for the noncompensated amplifier. With the thermistor compensated amplifier designed, as prescribed by Equations 6 through 9 in column 3, input impedance is virtually invariant over this temperature range. Power gain, voltage gain, and current gain vary by −0% to +40% from their nominal values in the noncompensated case. Thermistor compensation, applied as prescribed by Equations 6 through 9 in column 3, stabilized power gain, voltage gain, and current gain over this range so that no measurable deviation in these gains occurs over this temperature range.

For a temperature range of −30° C. to +100° C., the following comparison of temperature performance was made:

In the noncompensated case, the input impedance varies from −29% to +42% of the nominal or 25° C. value, while for the thermistor compensated circuit, based on Equations 6 through 9 in column 3, input impedance variation is +9%. This represents about an 8 to 1 improvement in stability.

Power gain in the noncompensated circuit varies from −45% to +54% of its nominal value. This is reduced, based on Equations 6 through 9 in column 3, to a maximum variation of +8% for the thermistor compensated circuit. The temperature behavior of current gain and voltage gain is essentially the same as for power gain and consequently the improvement in all three quantities is nearly identical.

The marked improvements achieved by means of the techniques described in this invention are apparent.

What is claimed is:

1. A network for compensating for the impedance variation with respect to temperature of a transistor circuit comprising a common-emitter-connected transistor having emitter, collector, and base electrodes; a source of negative voltage with respect to ground; a first transistor-impedance-compensating thermistor connected between said base electrode and said source of negative voltage; a second, transistor-impedance-compensating thermistor connected between said base electrode and said ground; a third, transistor-impedance-compensating thermistor and a fourth, direct-current, bias-compensating thermistor connected in series between said emitter electrode and said ground; a by-pass condenser connected across said fourth thermistor; and an output load impedance connected between said collector electrode and said source of negative voltage.

2. A network for compensating for the impedance variation with respect to temperature of a transistor circuit comprising a common-emitter-connected transistor having emitter, collector, and base electrodes; a source of negative voltage with respect to ground; a first, transistor-impedance-compensating thermistor connected between said base electrode and said source of negative voltage; a second, transistor-impedance-compensating thermistor connected between said base electrode and said ground; a third, transistor-impedance-compensating thermistor and a fourth, direct-current, bias-compensating thermistor connected in series between said emitter electrode and said ground; a by-pass condenser connected across said fourth thermistor; and a fifth transistor-impedance-compensating thermistor connected between said collector and said source of negative voltage.

References Cited by the Examiner

UNITED STATES PATENTS

| | | | |
|---|---|---|---|
| 2,914,685 | 11/1959 | McVey | 330—23 X |
| 3,105,198 | 9/1963 | Higginbotham | 330—23 X |
| 3,117,253 | 1/1964 | Antoszewski. | |

ROY LAKE, *Primary Examiner.*

N. KAUFMAN, *Assistant Examiner.*